(12) United States Patent
Amanapu et al.

(10) Patent No.: US 11,037,795 B2
(45) Date of Patent: Jun. 15, 2021

(54) PLANARIZATION OF DIELECTRIC TOPOGRAPHY AND STOPPING IN DIELECTRIC

(71) Applicant: International Business Machines Corporation, Armonk, NY (US)

(72) Inventors: Hari Prasad Amanapu, Albuquerque, NM (US); Cornelius Brown Peethala, Slingerlands, NY (US); Iqbal Rashid Saraf, Cobleskill, NY (US); Raghuveer Reddy Patlolla, Guilderland, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 16/530,165

(22) Filed: Aug. 2, 2019

(65) Prior Publication Data
US 2021/0035813 A1   Feb. 4, 2021

(51) Int. Cl.
*H01L 21/3105* (2006.01)
*H01L 21/02* (2006.01)
*H01L 21/311* (2006.01)

(52) U.S. Cl.
CPC .... *H01L 21/31053* (2013.01); *H01L 21/0217* (2013.01); *H01L 21/02126* (2013.01);
(Continued)

(58) Field of Classification Search
CPC ......... H01L 21/31053; H01L 21/02167; H01L 21/02203; H01L 21/31111; H01L 21/02164; H01L 21/02126; H01L 21/0217
See application file for complete search history.

(56) References Cited

U.S. PATENT DOCUMENTS

| | | | |
|---|---|---|---|
| 5,674,784 A | 10/1997 | Jang et al. | |
| 5,679,214 A | 10/1997 | Kuo | |

(Continued)

FOREIGN PATENT DOCUMENTS

| | | |
|---|---|---|
| KR | 100202192 B1 | 3/1999 |
| KR | 20030052167 A | 6/2003 |
| KR | 20050042313 A | 5/2005 |

OTHER PUBLICATIONS

Yi et al., "A Run-to-Run Film Thickness Control of Chemical-Mechanical Planarization Processes," 2005 American Control Conference, pp. 4231-4236, Jun. 8-10, 2005.

(Continued)

*Primary Examiner* — Karen Kusumakar
(74) *Attorney, Agent, or Firm* — L. Jeffrey Kelly; Michael J. Chang, LLC

(57) ABSTRACT

Techniques for planarization of dielectric topography that stop in dielectric are provided. In one aspect, a method for planarization includes: depositing a first dielectric onto a wafer having a surface topography with peaks and valleys; depositing a second, different dielectric onto the first dielectric; and polishing the second dielectric down to the first dielectric to form a planar surface at an interface between the first dielectric and the second dielectric. Optionally, a follow-up CMP or etch can be performed using a ~1:1 selective polish or etch to completely remove the second dielectric and an equivalent amount of the first dielectric to form a planar surface devoid of the peaks and valleys in the first dielectric. A device structure formed by the present techniques is also provided.

16 Claims, 4 Drawing Sheets

(52) U.S. Cl.
CPC .. *H01L 21/02164* (2013.01); *H01L 21/02167* (2013.01); *H01L 21/02203* (2013.01); *H01L 21/31111* (2013.01)

(56) References Cited

U.S. PATENT DOCUMENTS

| | | | | |
|---|---|---|---|---|
| 5,948,700 | A * | 9/1999 | Zheng | H01L 21/31053 216/86 |
| 6,028,669 | A | 2/2000 | Tzeng | |
| 6,399,461 | B1 | 6/2002 | Liu et al. | |
| 6,569,769 | B1 | 5/2003 | Economikos et al. | |
| 6,916,525 | B2 * | 7/2005 | Bothra | B24B 37/013 257/E21.244 |
| 7,040,958 | B2 | 5/2006 | Gan et al. | |
| 7,696,095 | B2 | 4/2010 | Oswald et al. | |
| 7,848,839 | B2 | 12/2010 | Zutshi et al. | |
| 8,975,179 | B2 | 3/2015 | Tu et al. | |
| 9,768,064 | B1 * | 9/2017 | Hsu | H01L 21/76883 |
| 2018/0330748 | A1 * | 11/2018 | Liu | G11B 5/3143 |

OTHER PUBLICATIONS

Lee et al., "Selective Etching of Thick Si3N4, SiO2 and Si by Using CF4/O2 and C2F6 Gases with or Without O2 or Ar Addition," Journal of the Korean Physical Society, vol. 54, No. 5 May 2009, pp. 1816-1823.

Zhang et al., "Fullvision Endpoint Application on ILD0 P1 Polish," ECS Transactions, vol. 60, issue 1, Mar. 2014 (Abstract) (1 page).

Cooper et al., "In-Situ Endpoint Detection Method for Chemical Mechanical Polishing of Dielectrics" IPCOM000033055D Nov. 23, 2004 (5 pages).

Disclosed Anonymously "Self-Aligned Contact by Gate Reveal Method" IPCOM000246632D Jun. 23, 2016 (4 pages).

English Translation of KR20030052167A, Jun. 26, 2003 by Jung, Yong Sik et al. (5 pages).

English Translation of KR20050042313A, May 9, 2005 by Kim Seung Hyun (7 pages).

English Translation of KR100202192B1, Mar. 18, 1999 by Kim Yeong Su (5 pages).

\* cited by examiner

PLANARIZATION OF DIELECTRIC TOPOGRAPHY AND STOPPING IN DIELECTRIC

FIELD OF THE INVENTION

The present invention relates to planarization of dielectrics, and more particularly, to techniques for planarization of dielectric topography that stop in dielectric, and structures resulting therefrom.

BACKGROUND OF THE INVENTION

Chemical-mechanical polishing (CMP) is a process commonly employed in semiconductor processing to polish materials, providing a smooth, planar surface. For instance, after deposition of a dielectric fill, CMP is often employed to polish the dielectric to provide a flat surface upon which additional elements, layers/levels of the device can be built. As its name implies, CMP uses a combination of chemical and mechanical polishing steps.

In some instances, it is desirable to planarize the topography of a layer, while stopping in the same layer. For instance, when the dielectric fill is deposited over and covering one or more device elements, one may want to polish the dielectric without exposing the underlying elements. Doing so, however, can present some notable challenges.

For instance, conventional approaches involve use of a timed polish with optimized consumables, whereby the end-point timing of the etch is based on characteristics of the material being polished (such as the etch rate through the material, amount of material to be removed, etc.). However, the reliability of such a process is dependent on a variety of different factors that are oftentimes beyond control. For instance, variations in the incoming topography (e.g., magnitude and/or number of peaks and valleys) which can vary from wafer to wafer (inter-wafer variation) and/or within the same wafer (intra-wafer variation) affect the results of a timed polish, which makes stopping the etch in the same layer unreliable.

Another approach is to use an advanced process controlled (APC) technique with optimized consumables. With this approach, the polish rate variation and other feedback parameters from previous runs are used to determine a corrective polishing times. However, the successful implementation of APC is a tedious process that needs reliable wafer history, frequent tool qualification rate data, and a lot of other resources.

Therefore, improved techniques for planarization of dielectric topography and stopping in the same dielectric layer would be desirable.

SUMMARY OF THE INVENTION

The present invention provides techniques for planarization of dielectric topography that stop in dielectric. In one aspect of the invention, a method for planarization is provided. The method includes: depositing a first dielectric onto a wafer, wherein the first dielectric, as deposited, has a surface topography with peaks and valleys; depositing a second dielectric onto the first dielectric, wherein the second dielectric is a different material from the first dielectric; and polishing the second dielectric down to the first dielectric to form a planar surface at an interface between the first dielectric and the second dielectric.

In another aspect of the invention, another method for planarization is provided. The method includes: depositing a first dielectric onto a wafer, wherein the first dielectric, as deposited, has a surface topography with peaks and valleys; depositing a second dielectric onto the first dielectric, wherein the second dielectric is a different material from the first dielectric; polishing the second dielectric down to the first dielectric to form a planar surface at an interface between the first dielectric and the second dielectric; and completely removing the second dielectric and an equivalent amount of the first dielectric using a ~1:1 selective polish or etch to form a planar surface devoid of the peaks and valleys in the first dielectric.

In yet another aspect of the invention, a device structure is provided. The device structure includes: a wafer; a first dielectric disposed on the wafer, the first dielectric having a surface topography comprising peaks and valleys; and a second dielectric disposed on the first dielectric, wherein the second dielectric fills the valleys forming a planar surface at an interface of the first and second dielectric layers.

A more complete understanding of the present invention, as well as further features and advantages of the present invention, will be obtained by reference to the following detailed description and drawings.

DETAILED DESCRIPTION OF PREFERRED EMBODIMENTS

Figure 1:
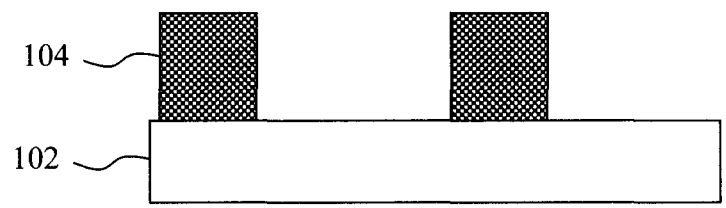
FIG. 1 is a cross-sectional diagram illustrating a wafer on which one or more device elements have been formed according to an embodiment of the present invention.

Provided herein are techniques for planarization of dielectric topography that stop in the same layer, and structures resulting therefrom. Advantageously, as compared to a timed polish process, the present techniques are less dependent on inter- and intra-wafer variations in the incoming topology. Further, as compared to an advanced process controlled (APC) technique, the present process does not require empirical data or tedious and time-consuming calculations and metrics.

As will be described in detail below, to planarize a (first) dielectric layer having topology while stopping in that layer, the present process involves depositing a second/different dielectric on top of the first dielectric. A polishing process (such as a motor torque end point technique) is then used to polish the second dielectric, stopping on the first dielectric to produce a planar surface in the first dielectric. Since the second dielectric conforms to the topology in the first dielectric, after polishing the planar surface (i.e., a surface devoid of peaks and valleys) is formed at the interface of the first and second dielectrics.

However, it may be desirable to remove the second dielectric completely. In that case, following-up with a ~1:1 selective polish or etch to remove an additional amount of the first dielectric is performed. For instance, by way of example only, a follow-up chemical-mechanical polishing (CMP) can be performed using a ~1:1 selective slurry that removes the first dielectric and the second dielectric at about the same rate. By "about the same rate" it is meant that the removal rate of the slurry in the first dielectric and in the second dielectric differs by less than about 0.5 nanometers per minute (run/min), e.g., from about 0 nm/min to about 0.25 inn/min and ranges therebetween. Thus, the slurry would have about the same polish rate for the first dielectric and the second dielectric.

A timed polish with the ~1:1 selective slurry can be performed. In this case, however, the slurry is being used on an already planar surface. Thus, the above-mentioned variables (e.g., inter-/intra-wafer topography variations) are not a factor and one simply has to take into account the polish rate and desired amount of material to remove. Further, use of a ~1:1 selective slurry will ensure that the surface remains planar since the first and second dielectrics will be removed at approximately the same rate.

Additional control over the follow-up etch can be achieved using, e.g., a directional (anisotropic) etching process such as reactive ion etching (RIE), with a ~1:1 selective etch chemistry using a (e.g., nitride, carbon, etc.) signal from the second dielectric as a guide. As above, the term "~1:1 selective etch chemistry" as used herein means that the etch removes the first dielectric and the second dielectric at about the same rate. For example, when the first dielectric is an oxide dielectric material and the second dielectric is a nitride dielectric material, the etch chemistry selected would have about the same etch rate for the oxide and nitride dielectrics. As above, by "about the same rate" it is meant that the removal rate of the etch in the first dielectric and in the second dielectric differs by less than about 0.5 nm/min, e.g., from about 0 nm/min to about 0.25 nm/min and ranges therebetween. Further, tracking of the nitride signal (i.e., an endpoint detection signal) can be used to determine when all of the second dielectric has been removed. Use of a ~1:1 selective etch chemistry will ensure that the surface remains planar since the first and second dielectrics will be removed at approximately the same rate. By way of example only, RIE using a fluorocarbon-based plasma can be used to etch the first dielectric and the second dielectric at about the same rate, i.e., ~1:1 etch selectivity.

Given the above overview, an exemplary embodiment of the present techniques for planarization is now described by way of reference to FIGS. 1-7. As shown in FIG. 1, the process begins with a wafer 102 onto which a dielectric will be deposited and then planarized (stopping in the same layer)—see below. According to an exemplary embodiment, the present techniques are implemented in the fabrication of a semiconductor device, wherein wafer 102 is a semiconductor wafer on which one or more device elements 104 have been formed.

According to an exemplary embodiment, wafer 102 is a bulk semiconductor wafer, such as a bulk silicon (Si), bulk germanium (Ge), bulk silicon germanium (SiGe) and/or bulk III-V semiconductor wafer. Alternatively, wafer 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. It is notable, however, that the present techniques are not limited to the fabrication of a semiconductor device, or to any type of device in particular, and wafer 102 is generally representative of any type substrate onto which a dielectric will be deposited and then planarized in the course of a process flow.

Device elements 104 are generally representative of any type of device and/or device structure that may be formed on wafer 102 during a given process flow, that will later be covered/buried in a dielectric. For illustrative purposes only, device elements 104 can include, but are not limited to, semiconductor devices such as transistors, capacitors, diodes, etc. and/or interconnect structures such as wires, metal lines, vias, etc. The notion here is that these device elements 104 will be covered/buried in a dielectric which, in accordance with the present techniques, will then be planarized (to remove its topography) while effectively stopping in that same dielectric layer. That way, following planarization, the device elements will remain buried in the dielectric.

Figure 2:
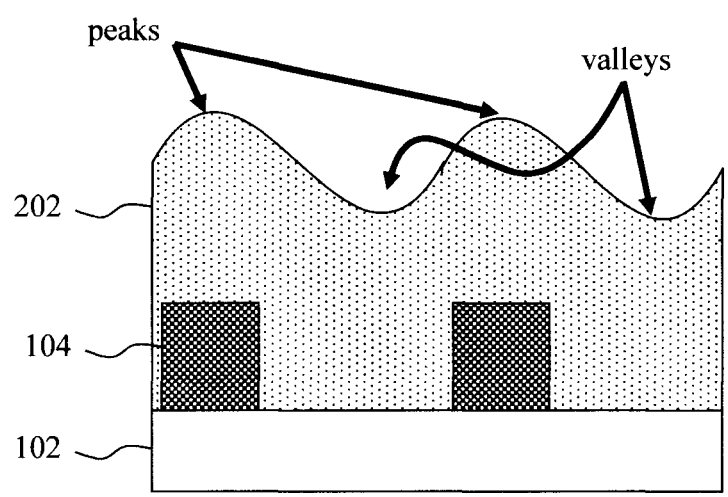
FIG. 2 is a cross-sectional diagram illustrating a first dielectric having been deposited onto the wafer, covering the device elements, wherein the first dielectric has a surface topography made up of a series of peaks and valleys according to an embodiment of the present invention.

Namely, as shown in FIG. 2, a dielectric 202 is next deposited onto the wafer 102, covering the device elements 104. Suitable dielectrics 202 include, but are not limited to, oxide materials such as silicon oxide (SiOx) and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

Dielectric 202 can be deposited onto wafer 202 using a process such as chemical vapor deposition (CVD), atomic layer deposition (ALD) or physical vapor deposition (PVD). Enough of dielectric 202 is deposited onto wafer 102 to fully cover the device elements 104, as well as to provide an overburden of the dielectric 202 above the device elements 104 which can be planarized (stopping within the dielectric 202) without exposing the underlying device elements 104.

As shown in FIG. 2, dielectric 202 has a surface topography made up of a series of peaks and valleys. These peaks and valleys will be removed using the present techniques to provide a planar surface in the dielectric 202 that is devoid of any peaks and valleys. To do so, a different dielectric 302 is first deposited onto dielectric 202. See FIG. 3. For clarity, dielectric 202 may also be referred to herein as a "first dielectric" and dielectric 302 may also be referred to herein as a "second dielectric." Dielectric 302 is a different material than dielectric 202 meaning that dielectric 302 has a different composition than dielectric 202. For instance, to use a non-limiting example to illustrate this concept, dielectric 202 can be an oxide dielectric material such as SiOx, SiCOH and/or pSiCOH (see above) while dielectric 302 is a nitride dielectric material. Use of different dielectric materials provides an interface at which the present planarization process can be endpointed at and, optionally, the basis for a signal used to endpoint a follow-up etch, if so desired (see below).

Suitable dielectric materials 302 include, but are not limited to, silicon nitride (SiN), silicon carbide (SiC), silicon oxycarbide (SiOC), silicon carbonitride (SiCN) and/or silicon oxycarbonitride (SiOCN). As provided above, a different material is needed for dielectric 302 as compared to dielectric 202, and thus the selection of materials for these layers should be made accordingly.

Figure 3:
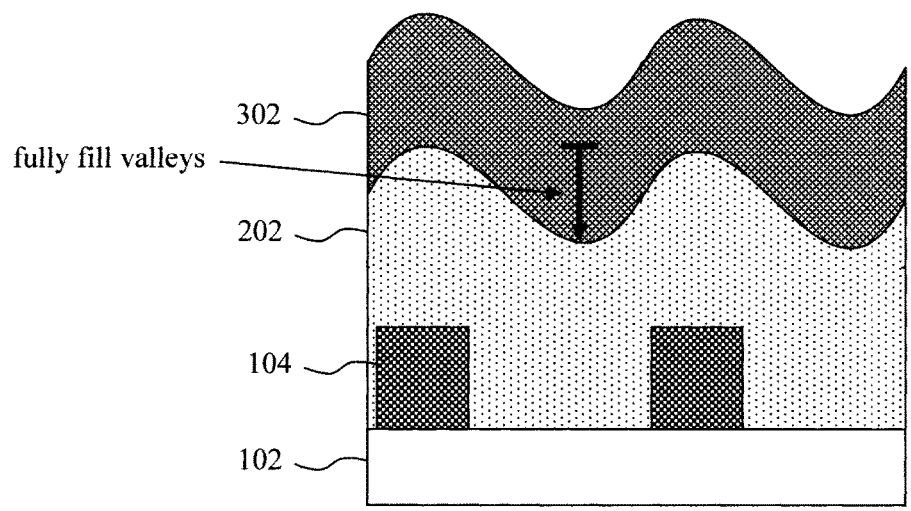
FIG. 3 is a cross-sectional diagram illustrating a second, different dielectric having been deposited onto the first dielectric fully filling the valleys in the first dielectric according to an embodiment of the present invention.

Dielectric 302 can be deposited onto dielectric 202 using a process such as CVD, ALD or PVD. As shown in FIG. 3, as deposited, dielectric 302 covers the peaks and valleys along the surface of dielectric 202. Further, dielectric 302 should be deposited to a thickness sufficient to fully fill each of the valleys. See FIG. 3. That way, polishing down to dielectric 202 at the peaks will leave behind a planar surface, i.e., with the valleys filled by dielectric 302.

Figure 4:
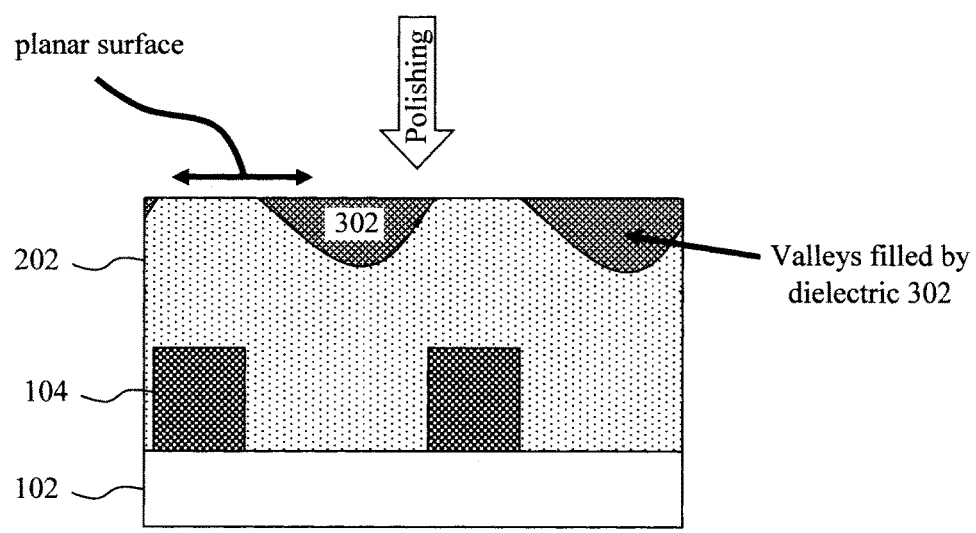
FIG. 4 is a cross-sectional diagram illustrating a polishing process having been used to polish the second dielectric down to the first dielectric to form a planar surface at an interface between the first dielectric and the second dielectric according to an embodiment of the present invention.

Namely, a polishing process (e.g., CMP) is then used to polish dielectric 302 down to dielectric 202. See FIG. 4. As shown in FIG. 4, this polishing results in a planar surface (i.e., a surface devoid of peaks and valleys) with the valleys in dielectric 202 being filled with dielectric 302. To create such a planar surface, the CMP process employed should polish dielectric 202 and dielectric 302 at about the same rate. As provided above, this is what is referred to herein as a ~1:1 selective CMP. By way of example only, slurries providing ~1:1 polish selectivity for dielectric 202 (e.g., SiOx, SiCOH and/or pSiCOH) and dielectric 302 (e.g., SiN, SiC, SiOC, SiCN and/or SiOCN) include, but are not limited to, alumina and/or ceria.

Suitable polishing processes include, but are not limited to, motor torque end point CMP. A CMP process generally involves use of a slurry of mechanically-abrasive particles and/or chemically-reactive particles, etc. deposited onto a disk-shaped polishing pad. The polishing pad, which is rotated by an electric motor, is then brought into contact with the workpiece surface to be polished. Friction between the pad and workpiece changes as the polishing progresses. Namely, as the peaks are reduced, the pad contacts more of the workpiece surface increasing friction, which also increases the torque needed by the motor to turn the pad. A unique part of the friction waveform can be used to signal an endpoint of the polishing, i.e., torque-based end-point detection.

Other suitable end-point detection techniques include, but are not limited to, a white light end point detection process whereby a multi-wavelength light source (i.e., white light) and a spectrometer are used to collect spectral signals from a wafer while polishing. The notion is that the intensity of the spectral signal will change as the thickness of the materials being polished changes.

According to one exemplary embodiment contemplated herein, the process is considered complete at this stage. The result is the formation of a unique dielectric structure (composed of dielectrics 202 and 302) on the wafer 102 over/covering the device elements 104. Namely, as shown in FIG. 4, the valleys in dielectrics 202 have been filled by dielectric 302 to form a planar surface devoid of peaks and valleys at the interface of these two dielectric layers. Further, since the polishing is stopped in the dielectric 202/302, the device elements 104 remain covered by dielectric.

On the other hand, in some cases it may be desirable to completely remove the second dielectric 302 using a follow-up polish (e.g., CMP) or etch. For instance, to use an illustrative example, the second dielectric 302 can be a nitride material. Subsequent steps in the process flow might involves patterning steps using a hardmask that can also be formed from a nitride material. In that case, it might be beneficial to remove what remains of the (nitride) dielectric 302 in order to avoid any interference with the patterning process.

Importantly, this follow-up polish (e.g., CMP) or etch is performed on a planar surface formed at the interface of (first) dielectric 202 and (second) dielectric 302 (see FIG. 4), one that is devoid of peaks and valleys. Thus, care must be taken to maintain that planarity through the follow-up processing. To do so, the follow-up polish (e.g., CMP) or etch is performed using a ~1:1 selective polish or etch stopping in (first) dielectric 202 which will remove the remaining (second) dielectric 302 as well as an equivalent additional amount of the (first) dielectric 202 such that a planar surface devoid of peaks and valleys is formed in the (first) dielectric 202. See FIG. 5.

Figure 5:
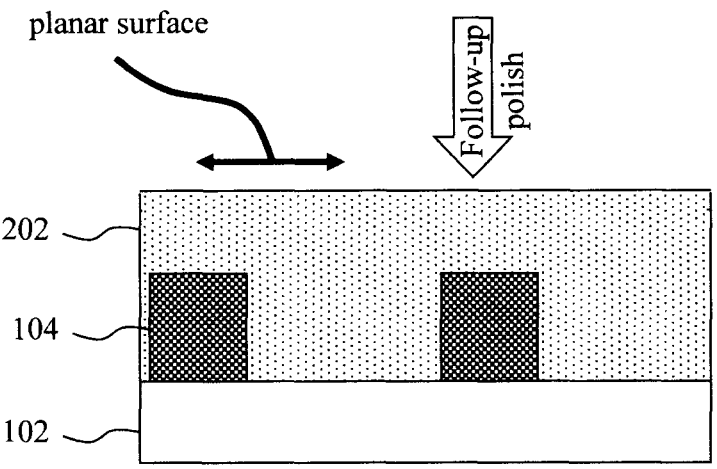
FIG. 5 is a cross-sectional diagram illustrating a follow-up etch having been optionally performed using a ~1:1 selective slurry stopping in first dielectric which removes the remaining second dielectric as well as an equivalent amount of the first dielectric such that a planar surface devoid of peaks and valleys is formed in the first dielectric according to an embodiment of the present invention.

According to an exemplary embodiment, a follow-up CMP is performed using a ~1:1 selective slurry that removes the (first) dielectric 202 and the (second) dielectric 302 at about the same rate (i.e., the removal rate of the slurry in the (first) dielectric 202 differs by less than about 0.25 nm/min from the removal rate of the slurry in the (second) dielectric 302—see above). As provided above, suitable ~1:1 selectivity slurries for dielectric 202 (e.g., SiOx, SiCOH and/or pSiCOH) and dielectric 302 (e.g., SiN, SiC, SiOC, SiCN and/or SiOCN) include, but are not limited to, alumina and/or ceria. Use of a ~1:1 selective slurry insures that, as the remaining (second) dielectric 302 is completely removed, an equal amount of the (first) dielectric 202 is also removed thereby preventing the introduction of any surface topography in order to maintain a planar surface. As shown in FIG. 5, the result is a planar surface devoid of peaks and valleys is formed in the (first) dielectric 202.

According to an exemplary embodiment, the follow-up CMP is performed using a timed polish with the ~1:1 selective slurry. Since the follow-up CMP is being performed on an already planar surface (compare FIG. 4 and FIG. 5), variations in topography are not a factor and one simply has to take into account the removal rate and desired amount of material to remove.

However, as highlighted above one might want more control over the timing of the follow-up polish or etch. For instance, according to an alternative embodiment, a follow-up etch is performed using a directional (anisotropic) etching process such as RIE, with a ~1:1 selective etch chemistry and signal tracking as a guide. See FIG. 6. Suitable ~1:1 selective etch chemistries are described above.

Figure 6:
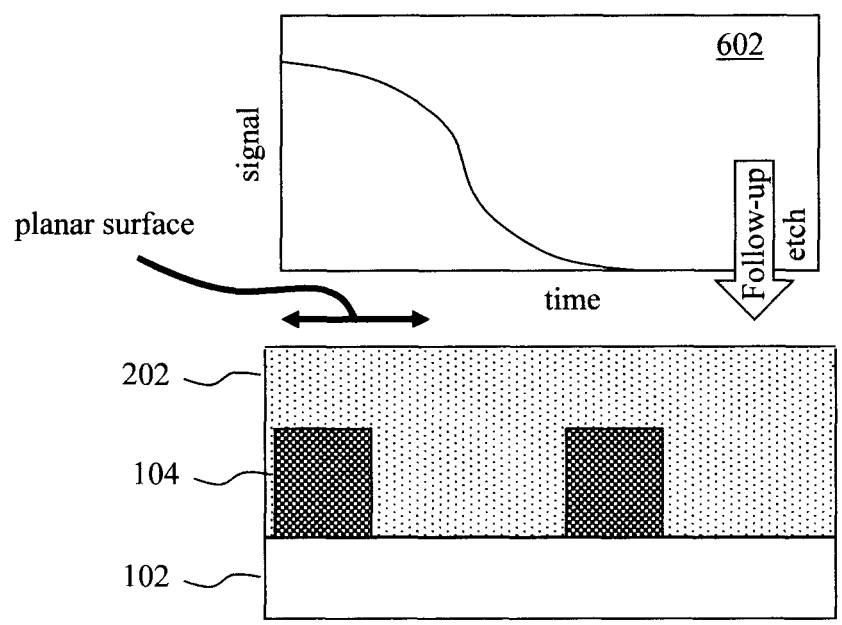
FIG. 6 is a cross-sectional diagram illustrating a follow-up etch having been optionally performed using an anisotropic etching process with a ~1:1 selective etch chemistry and signal tracking stopping in the first dielectric which removes the remaining second dielectric as well as an equivalent amount of the first dielectric such that a planar surface devoid of peaks and valleys is formed in the first dielectric according to an embodiment of the present invention.

Namely, as shown in FIG. 6, the ~1:1 selective RIE is performed while monitoring the signal from the (second) dielectric 302 as an endpoint detection signal. To use a simple, non-limiting example, when the (second) dielectric 302 includes nitrogen and/or carbon (see above), the nitrogen and/or carbon signal can be monitored during the follow-up etch. See plot 602 of signal versus time. Cessation of the signal endpoints the etch as it indicates that the (second) dielectric 302 has been completely removed. As above, use of a ~1:1 selective etch chemistry insures that, as the remaining (second) dielectric 302 is completely removed, an equal amount of the (first) dielectric 202 is also removed thereby preventing the introduction of any surface topography in order to maintain a planar surface. As shown in FIG. 6, the result is a planar surface devoid of peaks and valleys formed in the (first) dielectric 202.

Figure 7:
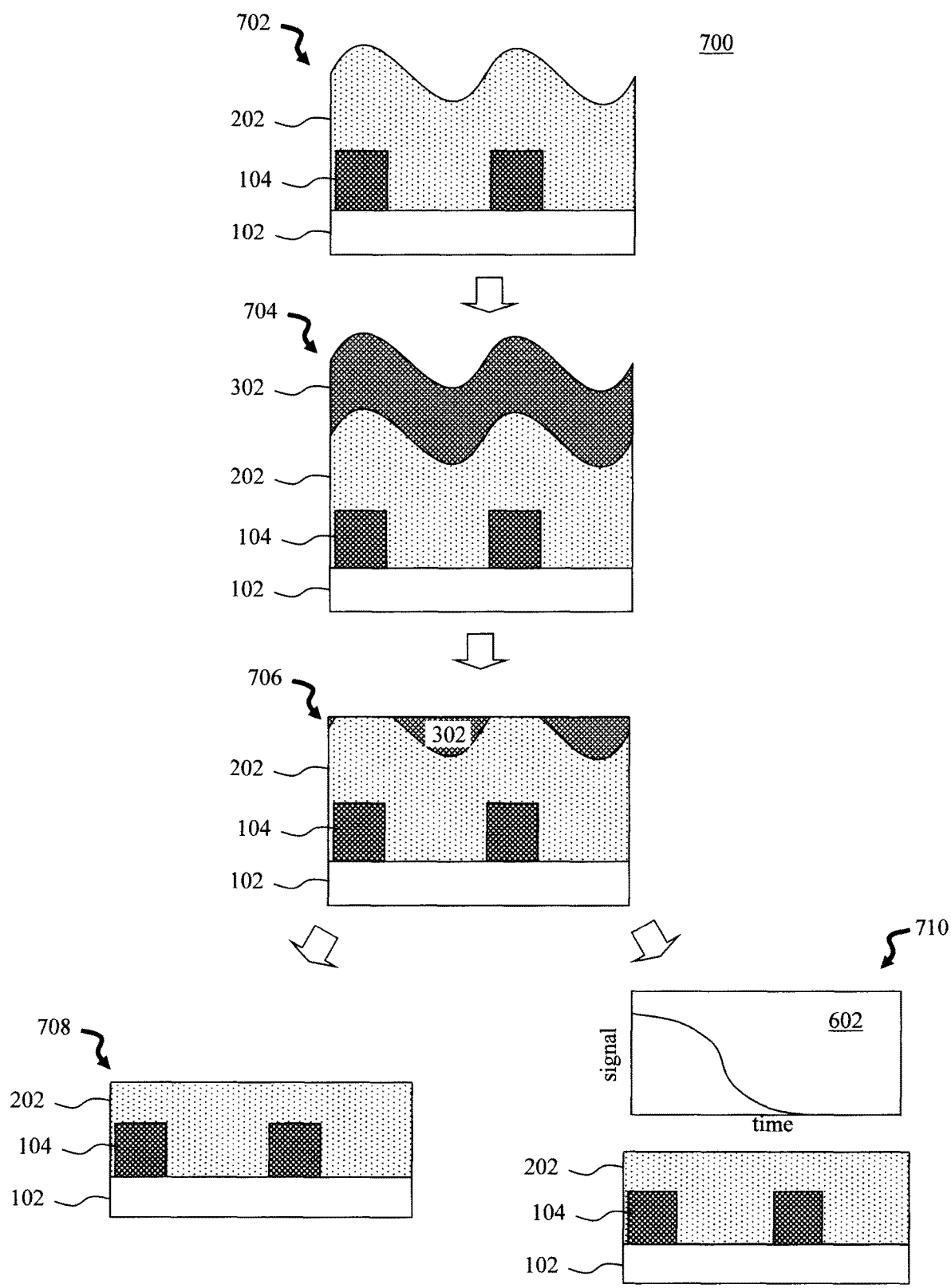
FIG. 7 is a diagram illustrating an exemplary method for planarization according to an embodiment of the present invention.

Methodology 700 of FIG. 7 summarizes the above-described techniques. Specifically, as shown in step 702, a (first) dielectric 202 (e.g., SiOx, SiCOH, and/or pSiCOH) is deposited onto a wafer 102 (e.g., over/covering device elements 104 on the wafer 102). The (first) dielectric 202 has a surface topography with peaks and valleys.

As shown in step 704, a (second) dielectric 302 is deposited onto the (first) dielectric 202. The (second) dielectric 302 includes a different material from the (first) dielectric 202 (e.g., SiN, SiC, SiOC, SiCN and/or SiOCN). Preferably, the (second) dielectric 302 fully fills the valleys in (first) dielectric 202.

As shown in step 706, the (second) dielectric 302 is polished down to the (first) dielectric 202 to form a planar surface at an interface between the (first) dielectric 202 and the (second) dielectric 302. According to an exemplary embodiment, this polishing is performed using a motor torque end point process. In some instances, the process may be considered complete at this point.

As provided above, it may however be desirable to completely remove the (second) dielectric 302. As shown in FIG. 7, this can be accomplished in a couple of different ways. In one exemplary embodiment, a follow-up CMP is performed using a timed polish with a ~1:1 selective slurry to completely remove the (second) dielectric 302 and an equivalent amount of the (first) dielectric 202 and form a planar surface devoid of the peaks and valleys in the (first) dielectric 202. See step 708.

Alternatively, in another exemplary embodiment, a follow-up etch is performed using an anisotropic etch (e.g., RIE) with a ~1:1 selective etch chemistry while monitoring a signal from the (second) dielectric 302 as an endpoint detection signal for the follow-up etch to completely remove the (second) dielectric 302 and an equivalent amount of the (first) dielectric 202 and form a planar surface devoid of the peaks and valleys in the (first) dielectric 202. See step 710.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for planarization, the method comprising the steps of:
    depositing a first dielectric onto a wafer, wherein the first dielectric, as deposited, has a surface topography comprising peaks and valleys;
    depositing a second dielectric directly onto and in physical contact with the first dielectric, wherein the second dielectric is a single layer that comprises a different material from the first dielectric and, as deposited, fully fills the valleys in the surface topography of the first dielectric;
    and polishing the second dielectric down to the first dielectric to form a planar surface at an interface between the first dielectric and the second dielectric, wherein device elements are present on the wafer, wherein the first dielectric is deposited onto the wafer covering the device elements, and wherein, following the polishing, the device elements remain completely buried in the first dielectric.

2. The method of claim 1, wherein the first dielectric comprises a material selected from the group consisting of: silicon oxide (SiOx), organosilicate glass (SiCOH), porous organosilicate glass (pSiCOH), and combinations thereof.

3. The method of claim 1, wherein the second dielectric comprises a material selected from the group consisting of: silicon nitride (SiN), silicon carbide (SiC), silicon oxycarbide (SiOC), silicon carbonitride (SiCN), silicon oxycarbonitride (SiOCN), and combinations thereof.

4. The method of claim 1, wherein the second dielectric is polished using a motor torque end point process.

5. The method of claim 1, further comprising the step of:
    performing a follow-up chemical-mechanical polishing (CMP) using a ~1:1 selective slurry to completely remove the second dielectric and an equivalent amount of the first dielectric to form a planar surface devoid of the peaks and valleys in the first dielectric.

6. The method of claim 5, wherein the follow-up CMP comprises a timed polish with the ~1:1 selective slurry.

7. The method of claim 1, further comprising the step of:
    performing a follow-up etch using an anisotropic etch with a ~1:1 selective etch chemistry to completely remove the second dielectric and an equivalent amount of the first dielectric to form a planar surface devoid of the peaks and valleys in the first dielectric.

8. The method of claim 7, further comprising the step of:
    monitoring a signal from the second dielectric as an endpoint detection signal for the follow-up etch.

9. A method for planarization, the method comprising the steps of:
    depositing a first dielectric onto a wafer, wherein the first dielectric, as deposited, has a surface topography comprising peaks and valleys;
    depositing a second dielectric directly onto and in physical contact with the first dielectric, wherein the second dielectric is a single layer that comprises a different material from the first dielectric and, as deposited, fully fills the valleys in the surface topography of the first dielectric;
    polishing the second dielectric down to the first dielectric to form a planar surface at an interface between the first dielectric and the second dielectric; and
    completely removing the second dielectric and an equivalent amount of the first dielectric using a ~1:1 selective polish or etch to form a planar surface devoid of the peaks and valleys in the first dielectric, wherein device elements are present on the wafer, wherein the first dielectric is deposited onto the wafer covering the device elements, and wherein, following complete removal of the second dielectric and an equivalent amount of the first dielectric, the device elements remain completely buried in the first dielectric.

10. The method of claim 9, wherein the first dielectric comprises a material selected from the group consisting of: SiOx, SiCOH, pSiCOH, and combinations thereof.

11. The method of claim 9, wherein the second dielectric comprises a material selected from the group consisting of: SiN, SiC, SiOC, SiCN, SiOCN, and combinations thereof.

12. The method of claim 9, wherein the second dielectric and the equivalent amount of the first dielectric are completely removed using a timed polish with a ~1:1 selective slurry.

13. The method of claim 9, wherein the second dielectric and the equivalent amount of the first dielectric are completely removed using an anisotropic etch with a ~1:1 selective etch chemistry.

14. The method of claim 13, further comprising the step of:
    monitoring a signal from the second dielectric as an endpoint detection signal for the anisotropic etch.

15. A device structure, comprising:
a wafer;
a first dielectric disposed on the wafer, the first dielectric having a surface topography comprising peaks and valleys; and
a second dielectric disposed directly on and in physical contact with the first dielectric, wherein the second dielectric is a single layer that comprises a different material from the first dielectric and that fully fills the valleys forming a planar surface at an interface of the first and second dielectric layers; and
device elements formed on the wafer, wherein the device elements are completely buried in the first dielectric.

16. The device structure of claim 15,
wherein the device elements are covered by the first dielectric and the second dielectric.

* * * * *